United States Patent [19]

Tsai et al.

[11] Patent Number: 5,753,418

[45] Date of Patent: May 19, 1998

[54] 0.3 MICRON APERTURE WIDTH PATTERNING PROCESS

[75] Inventors: Chia Shiung Tsai; Yuan-Chang Huang; Chen-Hua Yu. all of Hsin-Chu. Taiwan

[73] Assignee: Taiwan Semiconductor Manufacturing Company Ltd. Hsin-Chu. Taiwan

[21] Appl. No.: 706,876

[22] Filed: Sep. 3, 1996

[51] Int. Cl.⁶ .................................................. G03F 7/00
[52] U.S. Cl. .......................... 430/313; 430/316; 216/41; 216/72; 438/713; 438/738
[58] Field of Search .................... 430/311, 313, 430/316, 317; 216/41, 67, 72; 156/643.1, 646.1, 659.11; 438/713, 738

[56] References Cited

U.S. PATENT DOCUMENTS

| | | | |
|---|---|---|---|
| 5,219,788 | 6/1993 | Abernathey et al. | 437/187 |
| 5,368,989 | 11/1994 | Flaim et al. | 430/271 |
| 5,441,914 | 8/1995 | Taft et al. | 437/189 |
| 5,445,710 | 8/1995 | Hori | 156/643.1 |
| 5,472,829 | 12/1995 | Ogawa | 430/325 |

*Primary Examiner*—Kathleen Duda
*Attorney, Agent, or Firm*—George O. Saile; Stephen B. Ackerman; Alek P. Szecsy

[57] ABSTRACT

A method for forming a patterned layer within an integrated circuit. There is first provided a substrate having formed thereover a blanket target layer. There is then formed upon the blanket target layer a blanket focusing layer, where the blanket focusing layer is formed of an organic anti-reflective coating (ARC) material which is susceptible to a reproducible positive taper within a first etch method employed in forming from the blanket focusing layer a patterned focusing layer. The first etch method is a first plasma etch method employing an etchant gas composition comprising carbon tetrafluoride and argon. There is then formed upon the blanket focusing layer a blanket photoresist layer. The blanket photoresist layer is then photoexposed and developed layer to form a patterned photoresist layer. The blanket focusing layer is then etched through the first etch method to form the patterned focusing layer while employing the patterned photoresist layer as a first etch mask layer, where the patterned focusing layer has the reproducible positive taper with respect to the patterned photoresist layer and the blanket target layer. Finally, the blanket target layer is etched through a second etch method to form a patterned target layer while employing the patterned focusing layer as a second etch mask layer, where the patterned target layer has a reproducible second etch bias with respect to the patterned focusing layer, where the reproducible second etch bias does not substantially compensate the reproducible positive taper, and where the width of an aperture within the patterned target layer varies inversely as a function of the thickness of the patterned focusing layer.

19 Claims, 3 Drawing Sheets

0.3 MICRON APERTURE WIDTH PATTERNING PROCESS

BACKGROUND OF THE INVENTION

1. Field of the Invention

The present invention relates to methods for forming patterned layers within integrated circuits. More particularly, the present invention relates to methods for forming patterned layers of aperture width dimension as narrow as about 0.30 microns while employing i-line (ie: 365 nm) photoexposure radiation within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

As integrated circuit technology has advanced, there has been a continuing and correlating trend towards decreasing linewidth and aperture width dimensions of electrical circuit elements and patterned layers through which are formed those advanced integrated circuits. The decreasing linewidth and aperture width dimensions have typically traditionally been effected principally through decreasing the wavelength of photoexposure radiation employed in forming patterned photoresist layers which are employed in defining the linewidth and aperture width dimensions of those electrical circuit elements and patterned layers. Currently, photoexposure radiation is typically in the near ultra-violet (NUV) (ie: 365 nm) wavelength region for forming electrical circuit elements and patterned layers of linewidth and aperture width dimensions typically as low as about 0.35 microns, while the most advanced photoexposure tooling typically employs a photoexposure radiation in the deep ultra-violet (DUV) (ie: 254 nm) wavelength region or x-ray wavelength region for forming electrical circuit elements and patterned layers of linewidth and aperture width dimensions in the deep sub-micron region as low as about 0.18 microns.

While the trend towards decreasing wavelength of photoexposure radiation as a means for providing electrical circuit elements and patterned layers of decreased linewidth and aperture width dimensions within advanced integrated circuits will most certainly continue, it nonetheless becomes important to provide methods and materials through which the evolution from the current generations of integrated circuits having formed therein electrical circuit elements and patterned layers defined by photoexposure tooling employing a near ultra-violet (NUV) (ie: 365 nm) photoexposure radiation wavelength to future generations of integrated circuits having formed therein electrical circuit elements and patterned layers defined by advanced generations of photoexposure tooling employing a deep ultra-violet (DUV) (ie: 254 nm) photoexposure radiation wavelength or an x-ray photoexposure radiation wavelength may be smoothly facilitated.

In that regard, there has been disclosed in a related co-pending and co-assigned application by Y. C. Huang et al., "Etching Method for Extending i-Line Photolithography to 0.25 Micron Linewidth" application Ser. No. 08/701,605, filed Aug. 22, 1996, a general method through which there may be formed within integrated circuits electrical circuit elements and patterned layers of linewidth dimension, but not aperture width dimension, as narrow as about 0.25 microns while employing near ultra-violet (NUV) (ie: 365 nm) photoexposure radiation. The teachings of application Ser. No. 08/701,605, are incorporated herein fully by reference. The method disclosed in [TSMC 96-048] is particularly applicable to forming within advanced field effect transistors (FETs) gate electrodes of linewidth dimension as narrow as about 0.25 microns while employing near ultraviolet (NUV) (ie: 365 nm) photoexposure radiation. The method employs a blanket focusing layer formed of an organic anti-reflective coating (ARC) material formed beneath a patterned photoresist layer employed in patterning the patterned layers, such as the gate electrodes, from corresponding blanket layers.

Organic anti-reflective coatings (ARCs) may in general be formed from any of several organic polymer materials which intrinsically or extrinsically incorporate dye chromophores tuned to a particular wavelength of light whose reflection is desired to be attenuated. Such anti-reflective coatings (ARCs) are typically formed upon semiconductor substrates through spin coating of organic solvent solutions comprising the dye chromophore and the organic polymer material, as well as other additives, followed by thermal evaporation of the solvent. See, for example, Flaim et al., U.S. Pat. No. 5,368,989, the teachings of which are also incorporated herein fully by reference.

While the related co-pending and co-assigned application Ser. No. 08/701,605, is generally related to the present disclosure, there exist differences between the related co-pending and co-assigned application [TSMC 96-048] and the present invention. In particular, while the related co-pending and co-assigned application Ser. No. 08/701/605 is directed towards forming within integrated circuits patterned layers of linewidth, but not aperture width, dimension as narrow as about 0.25 microns while employing near ultra-violet (NUV) (ie: 365 nm) photoexposure radiation, the present invention is directed towards forming within integrated circuits patterned layers, in particular patterned silicon nitride layers, of aperture width dimension as narrow as about 0.30 microns while employing near ultra-violet (NUV) (ie: 365 nm) photoexposure radiation. The principal application of such silicon nitride layers within integrated circuit fabrication is in forming thermal oxidation masks employed in forming through a local oxidation of silicon (LOCOS) method field oxide (FOX) isolation regions within and upon a silicon semiconductor substrate. Conventionally, silicon nitride layers employed within thermal oxidation masks have typically been formed with a negative etch bias which precludes forming field oxide (FOX) isolation regions of width less than about 0.38 microns (including a "bird's beak" protrusion) within and upon a silicon semiconductor substrate when employing near ultra-violet (NUV) (ie: 356 nm) photoexposure radiation. In addition, while the methods and materials through which present invention achieves the goals towards which the present invention is directed are in general analogous to the methods and materials through which the goals of the related co-pending and co-assigned application [TSMC 96-048] are achieved, it will be understood by a person skilled in the art that the method and materials of the present invention achieve the goals of the present invention with enhanced process latitude.

Plasma etching methods which employ or include antireflective coating layers in forming patterned layers within integrated circuits are known in the art of integrated circuit fabrication. For example, Abernathey et al., in U.S. Pat. No. 5,219,788 disclose a method employing a silicon layer or a silicon oxide layer interposed between a metal nitride anti-reflective coating (ARC) layer and an acidic functional photoresist layer to prevent chemical interaction between the metal nitride anti-reflective coating (ARC) layer and the acidic functional photoresist layer when the acidic functional photoresist layer is photoexposed. Similarly, Taft et al., in U.S. Pat. No. 5,441,914 disclose the use of a thin silicon layer as an adhesion promoter layer between a patterned conductor interconnect layer and an inorganic anti-reflective coating (ARC) layer formed over the patterned conductor interconnect layer within an integrated circuit. Finally, Ogawa, in U.S. Pat. No. 5,472,829 discloses a method for forming a patterned photoresist layer while employing a silicon oxynitride anti-reflective coating (ARC) layer with optimized thickness, reflective refractive index and absorptive refractive index. In addition to the foregoing references which disclose anti-reflective coating (ARC) layers employed or included when forming patterned layers within integrated circuits, Meng et al., in U.S. Pat. No. 5,453,403 disclose a sequential isotropic etching, anisotropic etching and argon sputter etching method for forming through interlevel dielectric layers within integrated circuits contact or via holes with tapered sides and smooth edges.

Desirable in the art are additional methods and materials through which patterned layers of aperture width dimension as narrow as about 0.30 microns may be formed within integrated circuits while employing near ultra-violet (NUV) (ie: 365 nm) photoexposure radiation. More desirable are methods and materials through which patterned silicon nitride layers of aperture width dimension as narrow as about 0.30 microns may be formed within integrated circuits while employing near ultra-violet (NUV) (ie: 365 nm) photoexposure radiation. Most desirable are methods and materials which fulfill the foregoing criteria while providing methods with enhanced process latitude.

SUMMARY OF THE INVENTION

A first object of the present invention is to provide a method for forming for use within an integrated circuit a patterned layer of aperture width dimension as narrow as about 0.30 microns while employing near ultra-violet (NUV) (ie: 365 nm) photoexposure radiation.

A second object of the present invention is to provide a method in accord with the first object of the present invention, where the patterned layer is a patterned silicon nitride layer employed in forming within the integrated circuit a thermal oxidation mask employed in forming field oxide (FOX) isolation regions through a local oxidation of silicon (LOCOS) oxidation method.

A third object of the present invention is to provide a method in accord with the first object of the present invention or the second object of the present invention, which method is readily manufacturable and of enhanced process latitude.

In accord with the objects of the present invention, there is provided by the present invention a method for forming for use within an integrated circuit a patterned layer. To practice the method of the present invention, there is first provided a substrate having formed thereover a blanket target layer. Formed upon the blanket target layer is a blanket focusing layer, where the blanket focusing layer is formed from an organic anti-reflective coating (ARC) material and where the blanket focusing layer is susceptible to a reproducible positive taper within a first etch method employed in forming from the blanket focusing layer a patterned focusing layer. The first etch method is a first plasma etch method employing an etchant gas composition comprising carbon tetrafluoride and argon. There is then formed upon the blanket focusing layer a blanket photoresist layer which is photoexposed and developed to form a patterned photoresist layer. There is then etched through the first etch method the blanket focusing layer to form the patterned focusing layer while employing the patterned photoresist layer as a first etch mask layer. The patterned focusing layer so formed has the reproducible positive taper with respect to the patterned photoresist layer and the blanket target layer. Finally, the blanket target layer is etched through a second etch method to form a patterned target layer while employing the patterned focusing layer as a second etch mask layer. The patterned target layer has a reproducible second etch bias with respect to the patterned focusing layer, where the reproducible second etch bias does not substantially compensate the reproducible positive taper, and where the width of an aperture within the patterned target layer varies inversely with respect to the thickness of the blanket focusing layer.

When: (1) the blanket photoresist layer is photoexposed through a near ultra-violet (NUV) (ie: 365 nm) photoexposure radiation method and developed to yield the patterned photoresist layer of aperture width dimension as narrow as about 0.35 microns; (2) the reproducible positive taper of the patterned focusing layer with respect to the surface of the blanket target layer is from about 75 to about 85 degrees; and (3) the thickness of the blanket focusing layer is from about 500 to about 2500 angstroms, a patterned target layer, such a patterned silicon nitride layer employed in forming a thermal oxidation mask, of aperture width dimension as narrow as about 0.30 microns may be obtained through the method of the present invention.

The method of the present invention is readily manufacturable and the method of the present invention provides enhanced process latitude. As is disclosed within the preferred embodiment of the method of the present invention which is directed towards forming within and upon a silicon semiconductor substrate a patterned silicon nitride layer employed within a thermal oxidation mask, where the patterned silicon nitride layer has an aperture width dimension as narrow as about 0.30 microns while employing a near ultra-violet (NUV) (ie: 365 nm) photoexposure radiation method, the method of the present invention may be practiced through methods and materials as are generally known in the art of integrated circuit fabrication. Thus, the method of the present invention is readily manufacturable. In addition, since the method of the present invention employs the thickness of the blanket focusing layer to define in part the aperture width within the patterned target layer, the method of the present invention exhibits enhanced process latitude in comparison with analogous methods conventional in the art.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming for use within an integrated circuit a patterned target layer of aperture width dimension as narrow as about 0.30 microns while employing near ultra-violet (NUV) (ie: 365 nm) photoexposure radiation. The method of the present invention achieves this goal by employing a blanket focusing layer formed of an organic anti-reflective coating (ARC) material formed beneath a patterned photoresist layer which is employed in forming the patterned target layer from a blanket target layer. The blanket focusing layer is susceptible to a reproducible positive taper within a first etch method employed in forming a patterned focusing layer from the blanket focusing layer while employing the patterned photoresist layer as a first etch mask layer. The first etch method is a first plasma etch method employing an etchant gas composition comprising carbon tetrafluoride and argon. After forming the patterned focusing layer from the blanket focusing layer, the patterned focusing layer is employed as a second etch mask layer within a second etch method employed in forming from the blanket target layer the patterned target layer. The patterned target layer has a reproducible second etch bias with respect to the patterned focusing layer, where the reproducible second etch bias does not compensate the reproducible positive taper. Through the method of the present invention, the width of an aperture within the patterned target layer varies inversely with the thickness of the blanket focusing layer.

When: (1) the blanket photoresist layer is photoexposed through a near ultra-violet (NUV) (ie: 365 nm) photoexposure radiation method and developed to yield a patterned photoresist layer of aperture width dimension as narrow as about 0.35 microns; (2) the reproducible positive taper of the patterned focusing layer with respect to the surface of the blanket target layer is from about 75 to about 85 degrees; and (3) the thickness of the blanket focusing layer is from about 500 to about 2500 angstroms, a patterned target layer, such a patterned silicon nitride layer employed in forming a thermal oxidation mask, of aperture width dimension as narrow as about 0.30 microns may be obtained through the method of the present invention.

While the preferred embodiment of the method of the present invention is directed towards forming within an integrated circuit a patterned silicon nitride layer of aperture width dimension as narrow as about 0.30 microns for use within a thermal oxidation mask for forming field oxide (FOX) isolation regions through a local oxidation of silicon (LOCOS) method within and upon a silicon semiconductor substrate, it is understood by a person skilled in the art that the method of the present invention may be employed in forming within integrated circuits other patterned layers of aperture width dimension as narrow as about 0.30 microns while employing near ultra-violet (NUV) (ie: 365 nm) photoexposure radiation. Such other patterned layers may be formed from blanket layers including but not limited to blanket conductor layers, blanket insulator layers, blanket semiconductor layers and blanket photoactive layers. Typically, such other patterned layers will have a thickness of from about 100 to about 12000 angstroms.

Figure 1:
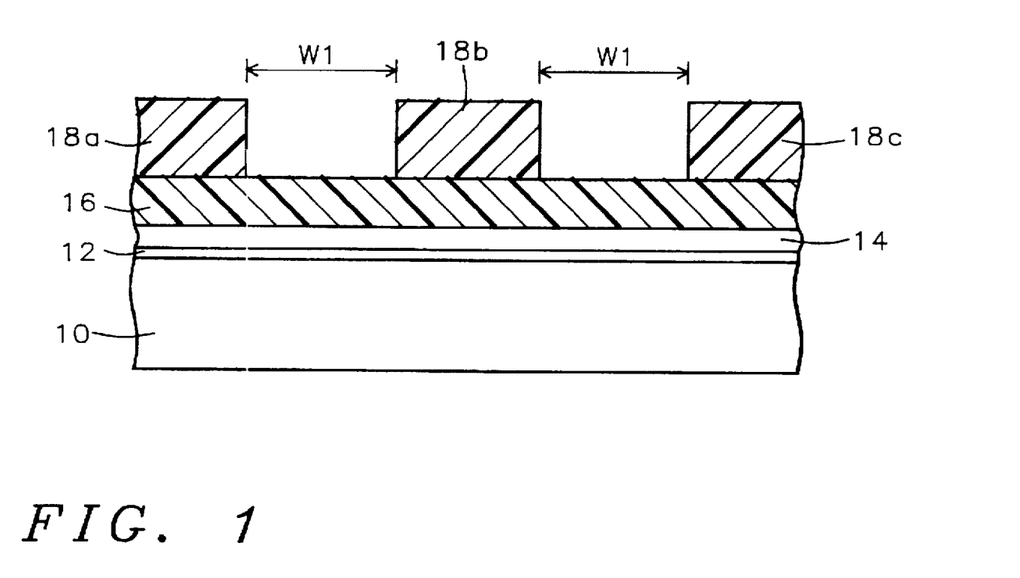
FIG. 1 to FIG. 6 show a series of schematic cross-sectional diagrams illustrating the results of progressive stages in forming within and upon a silicon semiconductor substrate field oxide (FOX) isolation regions through a local oxidation of silicon (LOCOS) method employing a thermal oxidation mask formed from a patterned silicon nitride layer formed through the preferred embodiment of the method of the present invention.

Referring now to FIG. 1 to FIG. 6, there is shown a series of schematic cross-sectional diagrams illustrating the results of progressive stages in forming within and upon a silicon semiconductor substrate a pair of field oxide (FOX) isolation regions through a local oxidation of silicon (LOCOS) thermal oxidation method employing a patterned silicon nitride layer formed through the preferred embodiment of the method of the present invention. Shown in FIG. 1 is a schematic cross-sectional diagram of the silicon semiconductor substrate at an early stage in its fabrication.

Shown in FIG. 1 is a silicon semiconductor substrate 10 having formed upon its surface a blanket pad oxide layer 12. Although silicon semiconductor substrates are known in the art with either dopant polarity, various dopant concentrations and several crystallographic orientations, for the preferred embodiment of the method of the present invention, the silicon semiconductor substrate 10 is preferably a (100) silicon semiconductor substrate having an N- or P- doping. Similarly, although it is also known in the art that blanket pad oxide layers may be formed upon silicon semiconductor substrates through methods including but not limited to blanket pad oxide layer deposition methods and blanket pad oxide layer thermal growth methods, for the preferred embodiment of the method of the present invention, the blanket pad oxide layer 12 is preferably formed through a blanket pad oxide layer thermal growth method at a temperature of from about 800 to about 950 degrees centigrade through which the blanket pad oxide layer 12 of thickness about 30 to about 200 angstroms is formed through partial consumption of the silicon semiconductor substrate 10.

Also shown in FIG. 1 is a blanket silicon nitride layer 14 formed upon the blanket pad oxide layer 12. Similarly with the blanket pad oxide layer 12, the blanket silicon nitride layer 14 may also be formed through methods and materials as are conventional in the art of integrated circuit fabrication. Thus, although it is known in the art that blanket silicon nitride layers may be formed within integrated circuits through methods including but not limited to physical vapor deposition (PVD) sputtering methods and chemical vapor deposition (CVD) methods, for the preferred embodiment of the method of the present invention the blanket silicon nitride layer 14 is preferably formed upon the blanket pad oxide layer 12 through a chemical vapor deposition (CVD) method employing silane as a silicon source material and ammonia as a nitrogen source material, as is most common in the art. Other methods and materials may, however, be employed in forming the blanket silicon nitride layer 14. Preferably, the blanket silicon nitride layer 14 so formed is from about 1000 to about 2000 angstroms thick.

There is also shown in FIG. 1 the presence of a blanket focusing layer 16 formed upon the blanket silicon nitride layer 14. For the method of the present invention, the blanket focusing layer 16 is formed of an organic anti-reflective coating (ARC) material which is susceptible to a reproducible positive taper within a first etch method employed in forming from the blanket focusing layer 16 a patterned focusing layer while employing a patterned photoresist layer as a first etch mask layer. The first etch method is a first plasma etch method employing an etchant gas composition comprising carbon tetrafluoride and argon. As discussed above within the Description of the Related Art, organic anti-reflective coating (ARC) materials are generally known in the art of integrated circuit fabrication. As further disclosed below within the EXAMPLE, a specific composition of an organic anti-reflective coating (ARC) material has been shown to provide a viable blanket focusing layer within the method of the present invention. Preferably, the blanket focusing layer 16 formed of the organic anti-reflective coating (ARC) material is from about 500 to about 2500 angstroms thick.

Finally, there is shown in FIG. 1 the presence of a series of patterned photoresist layers 18a, 18b and 18c formed upon the blanket focusing layer 16. Although patterned photoresist layers may in general be formed within integrated circuits from several photoresist materials derived from the general categories of photoresist materials including positive photoresist materials and negative photoresist materials, for the preferred embodiment of the method of the present invention, the patterned photoresist layers 18a, 18b and 18c are preferably formed of a positive novolak photoresist material, as is most commonly employed in the art when forming patterned photoresist layers of stable and reproducible dimensions when employing near ultra-violet (NUV) (ie: 365 nm) photoexposure radiation. Other types of photoresist materials may, however, be employed in forming the patterned photoresist layers 18a, 18b and 18c within the method of the present invention. From the positive novolak photoresist material there is formed the patterned photoresist layers 18a, 18b and 18c which define a pair of apertures having an aperture width WI, as illustrated in FIG. 1. When employing the positive novolak photoresist material and a near ultra-violet (NUV) (ie: 365 nm) photoexposure radiation method, there may typically be formed the patterned photoresist layers 18a, 18b and 18c which reproducibly define the pair of apertures with an aperture width WI dimension as narrow as about 0.35 microns.

Figure 2:
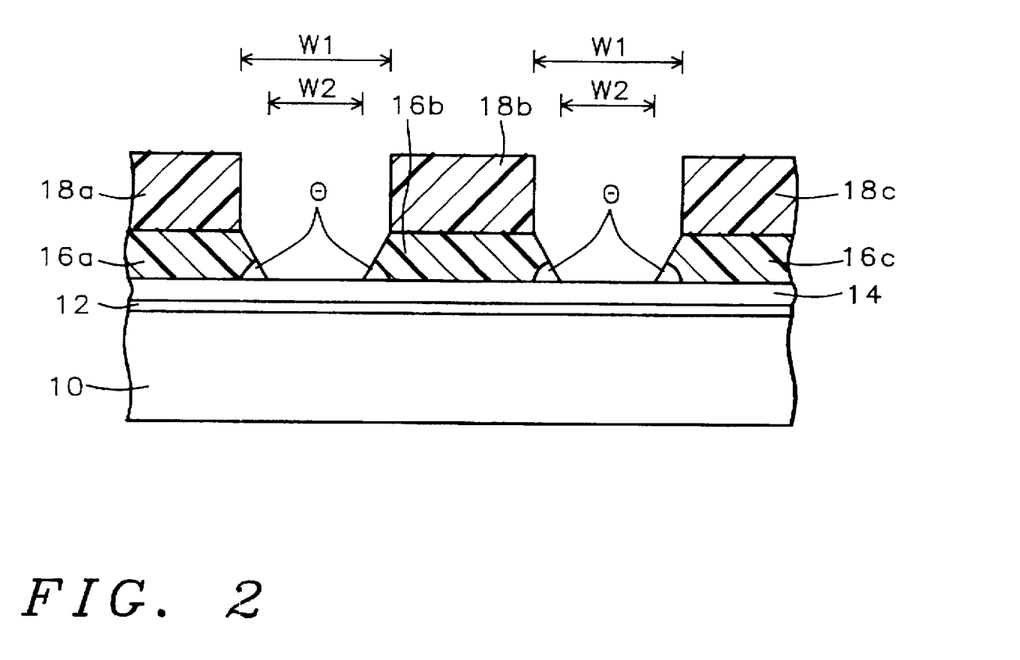

Referring now to FIG. 2, there is shown a schematic cross-sectional diagram illustrating the results of further processing of the silicon semiconductor substrate whose schematic cross-sectional diagram is illustrated in FIG. 1. Shown in FIG. 2 is the results of patterning through the first plasma etch method employing the etchant gas composition comprising carbon tetrafluoride and argon the blanket focusing layer 16 to form the patterned focusing layers 16a, 16b and 16c. As is illustrated in FIG. 2, the patterned focusing layers 16a, 16b and 16c have a positive taper with respect to both the patterned photoresist layers 18a, 18b and 18c and the blanket silicon nitride layer 14. As is illustrated in FIG. 2, the positive taper of the patterned focusing layers 16a, 16b and 16c with respect to the blanket silicon nitride layer 14 is illustrated by an angle $\Theta$, which angle $\Theta$ is preferably in the range of from about of from about 75 to about 85 degrees.

Conditions under which the patterned focusing layers 16a, 16b and 16c may be formed with the preferred positive taper with respect to the blanket silicon nitride layer 14 are largely defined by the parameters under which is provided the first plasma etch method, employing the etchant gas composition comprising carbon tetrafluoride and argon, through which first plasma etch method the blanket focusing layer 16 is patterned to form the patterned focusing layers 16a, 16b and 16c. Preferably, the first plasma etch method employing the etchant gas composition comprising carbon tetrafluoride and argon is employed at: (1) a reactor chamber pressure of from about 800 to about 1800 mtorr; (2) a radio frequency power of from about 800 to about 1300 watts at a radio frequency of 13.56 MHz; (3) a substrate temperature of from about zero to about 20 degrees centigrade; (4) a carbon tetrafluoride flow rate of from about 40 to about 120 standard cubic centimeters per minute (sccm); and (5) an argon flow rate of from about 400 to about 800 standard cubic centimeters per minute (sccm), for a time period sufficient to completely etch the blanket focusing layer 16 when forming the patterned focusing layers 16a, 16b and 16c from the blanket focusing layer 16, with minimal overetch. Preferably, the flow rate ratio of argon to carbon tetrafluoride within the first plasma etch method is from about 3.3:1 to about 20:1. In comparison with related plasma etch methods as are conventional in the art, it is believed that the reactor chamber pressure and the carbon tetrafluoride to argon flow rate ratio largely provide the desirable reproducible positive taper when forming the patterned focusing layers 16a, 16b and 16c from the blanket focusing layer 16.

When employing: (1) the patterned photoresist layers 18a, 18b and 18c which define the apertures of aperture width dimension WI as narrow as about 0.35 microns between the patterned photoresist layers 18a, 18b and 18c; (2) the first plasma etch method which provides a reproducible positive taper of the patterned focusing layers 16a, 16b and 16c with respect to the blanket silicon nitride layer 14 at the angle $\Theta$ from about 75 to about 85 degrees with respect to the blanket silicon nitride layer 14; and (3) the blanket focusing layer of thickness about 500 to about 2500 angstroms, there may be formed the tapered apertures defined by the patterned focusing layers 16a, 16b and 16c as illustrated in FIG. 2, where a bottom aperture width dimension, W2, as narrow as about 0.30 microns is obtained.

Figure 3:
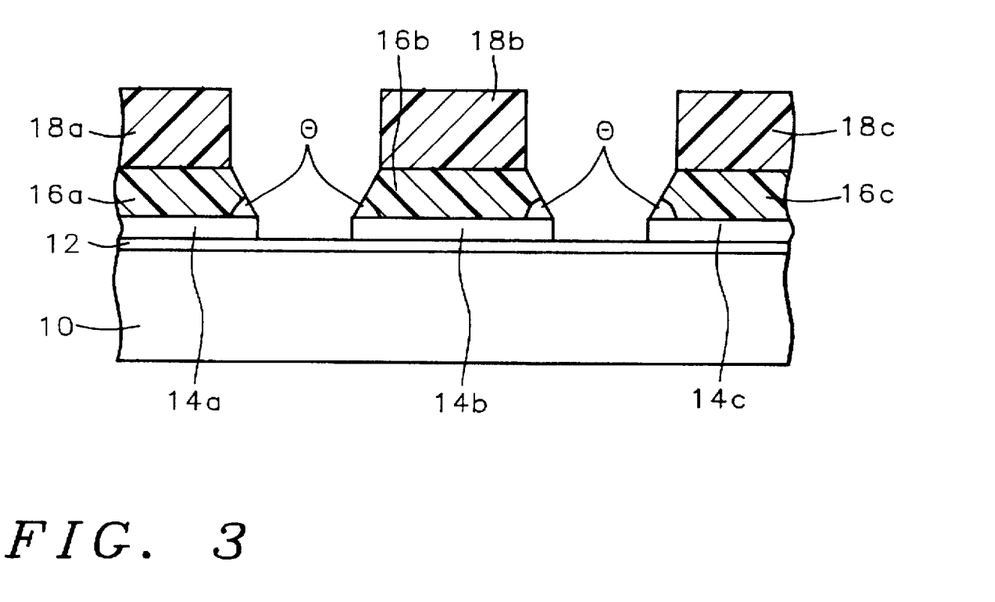

Referring now to FIG. 3, there is shown a schematic cross-sectional diagram illustrating the results of further processing of the silicon semiconductor substrate whose schematic cross-sectional diagram is illustrated in FIG. 2. Shown in FIG. 3 is the results of patterning, while employing the patterned focusing layers 16a, 16b and 16c as a second etch mask layer, the blanket silicon nitride layer 14 to form the patterned silicon nitride layers 14a, 14b and 14c.

Although the blanket silicon nitride layer 14 may be patterned to form the patterned silicon nitride layers 14a, 14b and 14c through any of several methods as are conventional in the art, including but not limited to wet chemical etch methods and dry plasma etch methods, for the preferred embodiment of the method of the present invention, the blanket silicon nitride layer 14 is preferably patterned to form the patterned silicon nitride layers 14a, 14b and 14c through a dry plasma etch method employing a fluorine containing etchant gas composition which preferably comprises carbon tetrafluoride and trifluoromethane, although additional etchant gas additives may also provide a reproducible positive taper (not shown) to the patterned silicon nitride layers 14a, 14b and 14c. Preferably the second plasma etch method employs: (1) a reactor chamber pressure of from about 300 to about 1800 mtorr; (2) a radio frequency power of from about 800 to about 1300 watts at a radio frequency of 13.56 MHZ; (3) a substrate temperature of from about zero to about 20 degrees centigrade; (4) a carbon tetrafluoride flow rate of from about 40 to about 120 standard cubic centimeters per minute (sccm); (5) a trifluoromethane flow rate of up to about 120 standard cubic centimeters per minute (sccm); and (6) a background helium flow rate sufficient to provide a stable plasma, for a time period sufficient to completely etch the patterned silicon nitride layers 14a, 14b and 14c with minimal attack of the blanket pad oxide layer 12.

When forming the patterned silicon nitride layers 14a, 14b and 14c from the blanket silicon nitride layer 14 through the second plasma etch method, it is preferred within the method of the present invention that the patterned silicon nitride layers 14a, 14b and 14c have a reproducible second etch bias with respect to the patterned focusing layers 16a, 16b and 16c, where the reproducible second etch bias does not compensate the positive taper of the patterned focusing layers 16a, 16b and 16c. Preferably, the reproducible second etch bias is approximately zero (ie: from about +0.02 to about −0.02 microns), while providing patterned silicon nitride layers 14a, 14b and 14c preferably having insubstantial sidewall taper.

Figure 4:
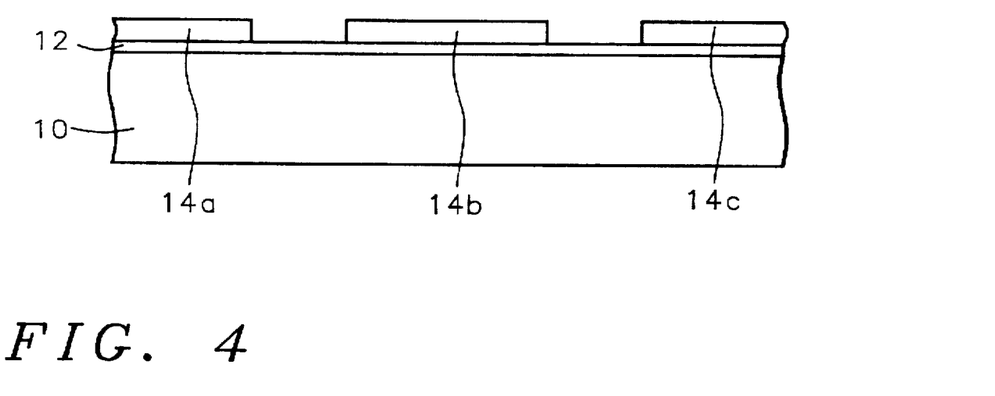

Referring now to FIG. 4, there is shown a schematic cross-sectional diagram illustrating the results of further processing of the silicon semiconductor substrate whose schematic cross-sectional diagram is illustrated in FIG. 3. Shown in FIG. 4 is a schematic cross-sectional diagram of a silicon semiconductor substrate otherwise equivalent to the silicon semiconductor substrate whose schematic cross-sectional diagram is illustrated whose surface from whose surface has been removed the patterned photoresist layers 18a, 18b and 18c, and the patterned focusing layers 16a, 16b and 16c. The patterned photoresist layers 18a, 18b and 18c, and the patterned focusing layers 16a, 16b and 16c, may be removed through methods as are conventional in the art, including but not limited to wet chemical stripping methods and dry plasma oxygen stripping methods. For the preferred embodiment of the method of the present invention, the patterned photoresist layers 18a, 18b and 18c, and the patterned focusing layers 16a, 16b and 16c, are preferably stripped from the silicon semiconductor substrate 10 whose schematic cross-sectional diagram is illustrated in FIG. 3 to yield the silicon semiconductor substrate 10 whose schematic cross-sectional diagram is illustrated in FIG. 4 through a dry plasma oxygen stripping method, as is conventional in the art.

Figure 5:
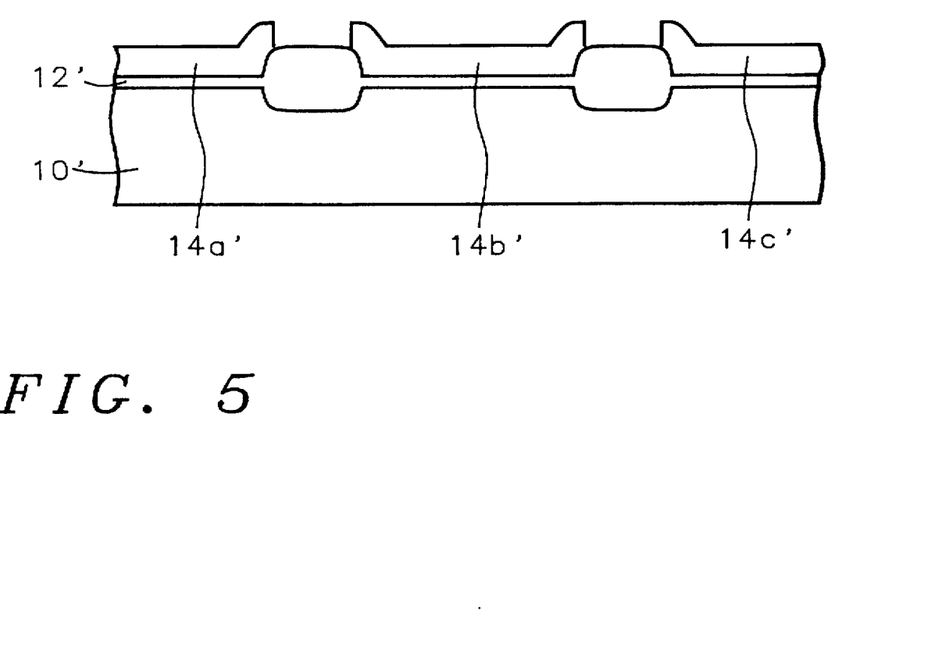

Referring now to FIG. 5, there is shown a schematic cross-sectional diagram illustrating the results of further processing of the silicon semiconductor substrate whose schematic cross-sectional diagram is illustrated in FIG. 4. Shown in FIG. 5 is the results of thermally oxidizing, while employing the patterned silicon nitride layers 14a, 14b and 14c as a thermal oxidation mask the blanket pad oxide layer 12 and the silicon semiconductor substrate 10 to form the thermally oxidized patterned silicon nitride layers 14a', 14b' and 14c', the thermally oxidized blanket pad oxide layer 12' and the partially consumed silicon semiconductor substrate 10'. The thermal oxidation method through which is formed the thermally oxidized patterned silicon nitride layers 14a', 14b' and 14c', the thermally oxidized blanket pad oxide layer 12' and the partially consumed silicon semiconductor substrate 10' is preferably undertaken through thermal oxidation methods as are conventional in the art, preferably at a temperature of from about 900 to about 930 degrees centigrade obtained within a total thermal oxidation cycle time period of from about 360 to about 480 minutes.

Figure 6:
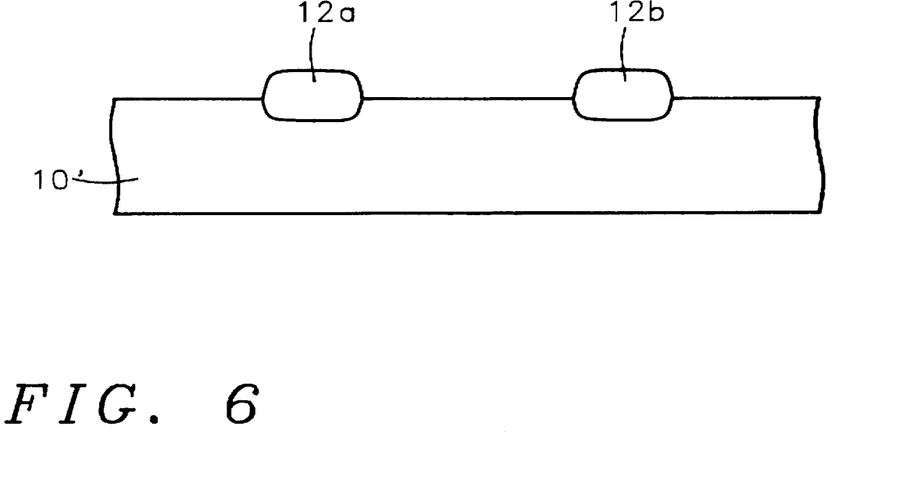

Referring now to FIG. 6, there is shown a schematic cross-sectional diagram illustrating the results of further processing of the silicon semiconductor substrate whose schematic cross-sectional diagram is illustrated in FIG. 5. Shown in FIG. 6 is the results of: (1) stripping completely the thermally oxidized patterned silicon nitride layers 14a', 14b', and 14c'; and (2) etching partially the thermally oxidized blanket pad oxide layer 12', to form the isolation regions 12a and 12b within and upon the partially consumed silicon semiconductor substrate 10'. The thermally oxidized silicon nitride layers 14a', 14b', and 14c' may be completely stripped, and the thermally oxidized blanket pad oxide layer 12' may be partially etched, through methods as are conventional in the art. Typically and preferably, although not exclusively, the thermally oxidized silicon nitride layers 14a', 14b' and 14c' are completely stripped within a refluxing concentrated phosphoric acid solution. Similarly, the thermally oxidized blanket pad oxide layer 12' is typically and preferably partially etched within a buffered oxide etchant (BOE) solution of appropriate concentration.

Upon completely stripping the thermally oxidized silicon nitride layers 14a', 14b' and 14c', and partially etching the thermally oxidized blanket pad oxide layer 12', there is formed through the method of the present invention a pair of field oxide (FOX) isolation regions 12a and 12b within and upon the partially consumed silicon semiconductor substrate 10', where the field oxide (FOX) isolation regions 12a and 12b are formed of a width as narrow as about 0.30 microns through a method employing near ultra-violet (NUV) (ie: 365 nm) photoexposure radiation.

EXAMPLE

Upon each eight inch silicon semiconductor substrate within a pair of eight inch silicon semiconductor substrates was formed a blanket pad oxide layer of thickness about 110 angstroms through a thermal oxidation method at a temperature of about 920 degrees centigrade for a time period of about 480 minutes. Upon each blanket pad oxide layer was then formed a blanket silicon nitride layer of thickness about 1700 angstroms through a chemical vapor deposition (CVD) method employing silane as a silicon source material and ammonia as a nitrogen source material. Upon each blanket silicon nitride layer was then formed a blanket focusing layer of an organic anti-reflective coating (ARC) material available from Brewer Science, Inc., Rolla, Mo., USA as product number XRHi-11, although functionally equivalent blanket focusing layers formed of other organic anti-reflective coating (ARC) materials available from the same or alternate suppliers may also be employed. The blanket focusing layers of the organic anti-reflective coating (ARC) material were formed upon the blanket silicon nitride layers through a spin coating method as is conventional in the art, followed by a thermal cure at a temperature of about 120 degrees centigrade for a time period of about 90 seconds to yield a blanket focusing layer, when cured, of thickness about 1500 angstroms. Finally, there was formed upon each blanket focusing layer a patterned photoresist layer formed of a novolak positive photoresist material available from Sumitomo Chemical Co. as PFi38 type positive novolak photoresist material. Each patterned photoresist layer was formed to a thickness of about 8000 angstroms. Each patterned photoresist layer formed of the novolak positive photoresist material had apertures defined therein of aperture width dimension about 0.36 microns, thus leaving exposed portions of the blanket focusing layers.

The exposed portions of the blanket focusing layers upon the two semiconductor substrates were then etched in a first plasma etch method employing an etchant gas composition comprising carbon tetrafluoride and argon. The first plasma etch method was employed at: (1) a reactor chamber pressure of about 1600 mtorr; (2) a radio frequency power of about 1000 watts at a radio frequency of 13.56 MM; (3) a substrate temperature of about zero degrees centigrade; (4) a carbon tetrafluoride flow rate of about 80 standard cubic centimeters per minute; and (5) an argon flow rate of about 600 standard cubic centimeters per minute, for a time period of about 40 seconds which included about 20 percent overetch.

One of the two silicon semiconductor substrates was then cleaved vertically and the resulting cross-section of the silicon semiconductor substrate was observed with the aid of a scanning electron microscope (SEM). From the cross-section so obtained there was observed: (1) a patterned focusing layer having reproducible positive tapers of about 80 degrees with respect to the blanket silicon nitride layer; and (2) bottom widths of about 0.32 microns of a series of tapered apertures defined by the patterned focusing layer.

The exposed portions of the blanket silicon nitride layer on the other silicon semiconductor substrate were then etched through a second plasma etch method while employing the patterned photoresist layers and the patterned focusing layers as a second etch mask layer. The second plasma etch method employed an etchant gas composition comprising carbon tetrafluoride and trifluoromethane at: (1) a reactor chamber pressure of about 300 mtorr, (2) a radio frequency power of about 1300 watts at a radio frequency of 13.56 MHZ; (3) a substrate temperature of about zero degrees centigrade; (4) a carbon tetrafluoride flow rate of about 80 standard cubic centimeters per minute (sccm); (5) a trifluoromethane flow rate of about 40 standard cubic centimeters per minute (sccm); and (6) a helium background flow rate sufficient to provide a stable plasma, for a time period of about 36 seconds which included about 20 percent overetch.

The patterned photoresist layer and the patterned focusing layer were then removed from the second silicon semiconductor substrate through an oxygen plasma stripping method as is conventional in the art, and the second silicon semiconductor substrate was cleaved vertically to provide a cross-section which was observed with the aid of the scanning electron microscope (SEM). From the cross-section of the second silicon semiconductor substrate there was observed patterned silicon nitride layers suitable as a thermal oxidation mask for forming field oxide (FOX) isolation regions within and upon the second silicon semiconductor substrate through a local oxidation of silicon (LOCOS) method, where the patterned silicon nitride layers defined apertures of aperture width dimension about 0.32 microns.

From the foregoing example, it is seen that there may be formed within an integrated circuit a patterned layer, such as a patterned silicon nitride layer, of aperture width dimension as narrow as about 0.30 microns while employing with enhanced process latitude a near ultra-violet (NUV) (ie: 365 nm) photoexposure radiation method.

As is understood by a person skilled in the art, the preferred embodiment and example of the method of the present invention are illustrative of the method of the present invention rather than limiting of the method of the present invention. Revisions may be made to structures, materials and dimensions through which is provided the preferred embodiment and example of the method of the present invention while still providing embodiments and examples which are within the spirit and scope of the method of the present invention, as defined by the accompanying claims.

What is claimed is:

1. A method for forming a patterned layer comprising:
   providing a substrate;
   forming over the substrate a blanket target layer;
   forming upon the blanket target layer a blanket focusing layer, the blanket focusing layer being formed of an organic polymer anti-reflective coating (ARC) material, the blanket focusing layer being susceptible to a reproducible positive taper within a first etch method employed in forming from the blanket focusing layer a patterned focusing layer, the first etch method being a first plasma etch method employing an etchant gas composition comprising carbon tetrafluoride and argon;
   forming upon the blanket focusing layer a blanket photoresist layer;
   photoexposing and developing the blanket photoresist layer to form a patterned photoresist layer;
   etching through use of the first etch method the blanket focusing layer to form the patterned focusing layer while employing the patterned photoresist layer as a first etch mask layer, the patterned focusing layer having the reproducible positive taper with respect to the patterned photoresist layer and the blanket target layer; and
   etching through use of a second etch method the blanket target layer to form a patterned target layer while employing the patterned focusing layer as a second etch mask layer, the patterned target layer having a reproducible second etch bias with respect to the patterned focusing layer, where the reproducible second etch bias does not substantially compensate the reproducible positive taper and where the width of an aperture within the patterned target layer varies inversely as a function of the thickness of the patterned focusing layer.

2. The method of claim 1 wherein the blanket target layer is chosen from the group of blanket target layers consisting of blanket conductor layers, blanket insulator layers, blanket semiconductor layers and blanket photoactive layers.

3. The method of claim 2 wherein the blanket target layer is from about 100 to about 12000 angstroms thick.

4. The method of claim 1 wherein:
   the blanket focusing layer is from about 500 to about 2500 angstroms thick.

5. The method of claim 1 wherein the blanket photoresist layer is photoexposed employing a near ultra-violet (NUV) 365 nanometer photoexposure radiation method and developed to yield the patterned photoresist layer of linewidth dimension as narrow as about 0.35 microns.

6. The method of claim 1 wherein within the first plasma etch method the flow rate ratio of argon to carbon tetrafluoride is from about 3.3:1 to about 20:1.

7. The method of claim 6 wherein the positive taper is from about 75 to about 85 degrees with respect to the surface of the blanket target layer.

8. A method for forming a patterned silicon nitride layer within an integrated circuit comprising:
   providing a semiconductor substrate;
   forming over the semiconductor substrate a blanket silicon nitride layer;
   forming upon the blanket silicon nitride layer a blanket focusing layer, the blanket focusing layer being formed of an organic polymer anti-reflective coating (ARC) material, the blanket focusing layer being susceptible to a reproducible positive taper within a first etch method employed in forming from the blanket focusing layer a patterned focusing layer, the first etch method being a first plasma etch method employing an etchant gas composition comprising carbon tetrafluoride and argon;
   forming upon the blanket focusing layer a blanket photoresist layer;
   photoexposing and developing the blanket photoresist layer to form a patterned photoresist layer;
   etching through use of the first etch method the blanket focusing layer to form the patterned focusing layer while employing the patterned photoresist layer as a first etch mask layer, the patterned focusing layer having the reproducible positive taper with respect to the patterned photoresist layer and the blanket silicon nitride layer; and
   etching through use of a second etch method the blanket silicon nitride layer to form a patterned silicon nitride layer while employing the patterned focusing layer as a second etch mask layer, the patterned silicon nitride layer having a reproducible second etch bias with respect to the patterned focusing layer, where the reproducible second etch bias does not substantially compensate the reproducible positive taper and where the width of an aperture within the patterned silicon nitride layer varies inversely as a function of the thickness of the patterned focusing layer.

13

9. The method of claim 8 wherein the blanket silicon nitride layer is from about 1000 to about 2000 angstroms thick.

10. The method of claim 8 wherein;
the blanket focusing layer is from about 500 to about 2500 angstroms thick.

11. The method of claim 8 wherein the blanket photoresist layer is photoexposed employing a near ultra-violet (NUV) 365 nanometer photoexposure radiation method and developed to yield the patterned photoresist layer of linewidth dimension as narrow as about 0.35 microns.

12. The method of claim 8 wherein within the first plasma etch method the flow rate ratio of argon to carbon tetrafluoride is from about 3.3:1 to about 20:1.

13. The method of claim 12 wherein the positive taper is from about 75 to about 85 degrees with respect to the surface of the blanket silicon nitride layer.

14. A method for forming within an integrated circuit a field oxide (FOX) isolation region through a local oxidation of silicon (LOCOS) method comprising:

providing a silicon semiconductor substrate;

forming over the silicon semiconductor substrate a blanket pad oxide layer;

forming over the blanket pad oxide layer a blanket silicon nitride layer;

forming upon the blanket silicon nitride layer a blanket focusing layer, the blanket focusing layer being formed of an organic polymer anti-reflective coating (ARC) material, the blanket focusing layer being susceptible to a reproducible positive taper within a first etch method employed in forming from the blanket focusing layer a patterned focusing layer, the first etch method being a first plasma etch method employing an etchant gas composition comprising carbon tetrafluoride and argon;

forming upon the blanket focusing layer a blanket photoresist layer;

photoexposing and developing the blanket photoresist layer to form a patterned photoresist layer;

etching through use of the first etch method the blanket focusing layer to form the patterned focusing layer

14 while employing the patterned photoresist layer as a first etch mask layer, the patterned focusing layer having the reproducible positive taper with respect to the patterned photoresist layer and the blanket silicon nitride layer;

etching through use of a second etch method the blanket silicon nitride layer to form a patterned silicon nitride layer while employing the patterned focusing layer as a second etch mask layer, the patterned silicon nitride layer having a reproducible second etch bias with respect to the patterned focusing layer, where the reproducible second etch bias does not substantially compensate the reproducible positive taper and where the width of an aperture within the patterned silicon nitride layer varies inversely as a function of the thickness of the patterned focusing layer; and oxidizing thermally through a local oxidation of silicon (LOCOS) method the blanket pad oxide layer and the silicon semiconductor substrate while employing the patterned silicon nitride layer as a thermal oxidation mask to form a field oxide (FOX) isolation region within and upon the silicon semiconductor substrate.

15. The method of claim 14 wherein the blanket silicon nitride layer is from about 1000 to about 2000 angstroms thick.

16. The method of claim 14 wherein; the blanket focusing layer is from about 500 to about 2500 angstroms thick.

17. The method of claim 14 wherein the blanket photoresist layer is photoexposed employing a near ultra-violet (NUV) 365 nanometer photoexposure radiation method and developed to yield the patterned photoresist layer of linewidth dimension as narrow as about 0.35 microns.

18. The method of claim 14 wherein within the first plasma etch method the flow rate ratio of argon to carbon tetrafluoride is from about 3.3:1 to about 20:1.

19. The method of claim 18 wherein the positive taper is from about 75 to about 85 degrees with respect to the surface of the blanket silicon nitride layer.

* * * * *